(12) United States Patent
Lin et al.

(10) Patent No.: US 8,222,743 B2
(45) Date of Patent: Jul. 17, 2012

(54) FLASH MEMORY STORAGE APPARATUS

(75) Inventors: Yu-Fong Lin, Taoyuan County (TW);
Hung-Yi Chung, Hsinchu County (TW);
Yu-Tong Lin, Hsinchu County (TW);
Yun-Chieh Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 428 days.

(21) Appl. No.: 12/472,637

(22) Filed: May 27, 2009

(65) Prior Publication Data
US 2010/0252931 A1     Oct. 7, 2010

(30) Foreign Application Priority Data
Apr. 6, 2009 (TW) .............................. 98111461 A

(51) Int. Cl.
*H01L 23/48* (2006.01)
(52) U.S. Cl. ................... 257/773; 257/E23.01
(58) Field of Classification Search ............. 257/E23.01, 257/773, 691–692, 784, 786
See application file for complete search history.

(56) References Cited

U.S. PATENT DOCUMENTS
2008/0224323 A1*  9/2008  Otremba .................. 257/778
* cited by examiner

*Primary Examiner* — Hoa B Trinh
(74) *Attorney, Agent, or Firm* — J.C. Patents

(57) ABSTRACT

A flash memory storage apparatus is provided. The flash memory storage apparatus includes a substrate, a control and storage circuit unit, a ground lead, at least a signal lead, and a power lead. The control and storage circuit unit, the power lead, the signal lead, and the ground lead are disposed on the substrate, in which the power lead, the signal lead, and the ground lead respectively electrically connect to the control and storage circuit unit. Moreover, the flash memory storage apparatus further includes an extra ground lead electrically connected to the ground lead or a protrusion on the substrate, such that the ground lead first electrically connects to a host when the flash memory storage apparatus is plugged into the host.

15 Claims, 11 Drawing Sheets

FLASH MEMORY STORAGE APPARATUS

CROSS-REFERENCE TO RELATED APPLICATION

This application claims the priority benefit of Taiwan application serial no. 98111461, filed on Apr. 6, 2009. The entirety of the above-mentioned patent application is hereby incorporated by reference herein and made a part of specification.

BACKGROUND

1. Technology Field

The present invention relates to a flash memory storage apparatus.

2. Description of Related Art

The growth of digital cameras, camera mobile phones, and MP3 players has been rapid in recent years. Consequently, the consumers' demand for storing digital data has increased tremendously. As the flash memory has characteristics such as data non-volatility, low power consumption, compact size, and non-mechanical structure, it is adapted for the user to carry around as storage medium for transmitting and exchanging digital files. A flash drive is a storage apparatus adopting NAND flash memory as storage medium.

3C products in the current marketplace are designed with a trend toward small, thin and light-weighted. In particular, this trend is more apparent in portable personal devices with a universal serial bus (USB) interface, for example, the flash memory storage apparatus adopting the USB interface as the transmission interface results in the demand in low-profile design. For example, a mini USB flash drive typically employs the gold finger of a printed circuit board to replace the design of conventional USB connector which includes a mechanical housing associated therewith, and is thus exposed outside to reduce the overall thickness of the product and achieve miniaturization.

Generally, the USB interface includes a power lead (VCC), a positive signal lead (D+), a negative signal lead (D−), and a ground lead (GND). Especially, when the USB flash drive is connected to the host through the USB interface, the pads of the power lead and the ground lead electrically connect to the connection port disposed on the host simultaneously. Therefore, the circuit unit of the USB flash drive is prevented from being damaged by the high voltage generated from plugging the USB flash drive into the connection port of the host. Hence, the housing disposed in the periphery of the gold finger of the conventional USB flash drive connects to the ground lead, so that when the USB flash drive is plugged into the host, the ground lead electrically connects to the connection port of the host with priority to prevent the damage resulting from the aforementioned high voltage.

However, as the above-mentioned mini USB flash drive is not disposed within a housing, when the mini USB flash drive is connected to the host, the ground lead may not be connected to the host due to incorrect plugging, so as to result in the damaging of the circuit of the mini USB flash drive by high voltage.

SUMMARY

A flash memory storage apparatus is provided in an exemplary embodiment of the present invention, where a ground lead thereof first electrically connects to a host when the flash memory storage apparatus is plugged into the host, thereby leading out the high voltage generated and preventing the internal circuit unit from being damaged.

In an exemplary embodiment, a flash memory storage apparatus including a substrate, a control and storage circuit unit, a power lead, at least one signal lead, a first ground lead, and at least one second ground lead is provided in an exemplary embodiment of the present invention. The substrate has a front surface, a back surface, and four side surfaces. Moreover, the control and storage circuit unit is disposed on the substrate. The power lead, the signal lead, and the first ground lead are separately disposed on the front surface of the substrate in intervals. In addition, the power lead, the signal lead, and the first ground lead are electrically connected to the control and storage circuit unit respectively. The second ground lead is disposed on the front surface of the substrate and located between the signal lead and an edge of the substrate. Moreover, one end of the second ground lead electrically connects to the first ground lead and the other end of the second ground lead extends to the edge or the power lead. Herein, the second ground lead is electrically isolated with the power lead and the signal lead.

In another exemplary embodiment, a flash memory storage apparatus including a substrate, a control and storage circuit unit, a power lead, at least one signal lead, and a protrusion is provided in an exemplary embodiment of the present invention. The substrate has a front surface, a back surface, and four side surfaces. Moreover, the control and storage circuit unit is disposed on the substrate. The power lead, the signal lead, and the ground lead are disposed on the front surface of the substrate in parallel. Moreover, the power lead, the signal lead, and the ground lead have an internal pad and an external pad respectively. The internal pads are connected to the control and storage circuit unit and the external pads are disposed on an edge of the substrate. The protrusion is disposed on the front surface and close to the external pad of the power lead and the aforementioned edge.

In an exemplary embodiment, a flash memory storage apparatus including a substrate, a control and storage circuit unit, a power lead, at least one signal lead, a first ground lead, and at least one second ground lead is provided in an exemplary embodiment of the present invention. The substrate has a front surface, and the control and storage circuit unit is disposed thereon. The power lead, the signal lead, and the first ground lead are separately disposed on the front surface of the substrate in intervals. The power lead, the signal lead, and the first ground lead are electrically connected to the control and storage circuit unit respectively. The second ground lead is disposed on the front surface and located between the signal lead and the edge of the substrate. Here, the edge is away from the control and storage circuit unit, and the second ground lead and the first ground lead have the same voltage level. In addition, the second ground lead is electrically isolated with the power lead and the signal lead.

In an exemplary embodiment, a flash memory storage apparatus including a substrate, a control and storage circuit unit, a power lead, at least one signal lead, a first ground lead, a second ground lead, and a third ground lead is provided in an exemplary embodiment of the present invention. The substrate has a front surface, and the control and storage circuit is disposed thereon. The power lead, the signal lead, and the first ground lead are separately disposed on the front surface of the substrate in intervals. Furthermore, the power lead, the signal lead, and the first ground lead are electrically connected to the control and storage circuit unit respectively. The second ground lead and the third ground lead are separately disposed on the front surface of the substrate in intervals and located between the signal lead and an edge of the substrate. The edge is away from the control and storage circuit unit. And, the second ground lead, the third ground lead and the first ground lead have the same voltage level. In addition, the second ground lead and the third ground lead are electrically isolated with the power lead and the signal lead.

In light of the foregoing, in an exemplary embodiment of the present invention, the second ground lead disposed on the substrate of the flash memory storage apparatus first electrically connects to the host so as to lead out the high voltage generated in the plugging process, thereby preventing the circuit unit of the flash memory storage apparatus from being damaged. Furthermore, the protrusion disposed on the substrate of the flash memory storage apparatus in the present invention facilitates the user to plug-in the flash memory storage apparatus into the host at a correct angle. Thus, the ground lead is ensured to be electrically connected to the host so as to lead out the high voltage generated in the plugging process, and prevent the circuit unit of the flash memory storage apparatus from being damaged.

In order to make the aforementioned and other features and advantages of the present invention more comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF EXEMPLARY EMBODIMENTS

As aforementioned, a conventional connection bus, such as mini universal serial bus (USB), which is referred as a mini USB flash drive in the following, omits the housing having electric conductivity of the conventional USB and exposes a gold finger on the outside to be pluggably connected to a host. In one exemplary embodiment of the present invention, in order to prevent circuits of the mini USB drive or memory apparatuses adopting other interfaces from being damaged by the high voltage generated from improper plugging, according to an exemplary embodiment of the present invention, a pad of a ground lead is first electrically connected to the connection port of the host when pads of a power lead, such as VCC, VDD, a first signal lead, such as D+, IO1, a second signal lead, such as D−, IO2, and the ground lead, such as GND, are plugged into the same. Several exemplary embodiments are described below to illustrate the present invention in detail. It should be noted that although the USB interface is illustrated in the following exemplary embodiment, the present invention is not limited thereto. The present invention can also be utilized in other data transmission interfaces such as pads of peripheral component interconnect express (PCIe), IEEE 1394, and the like.

Figure 1:
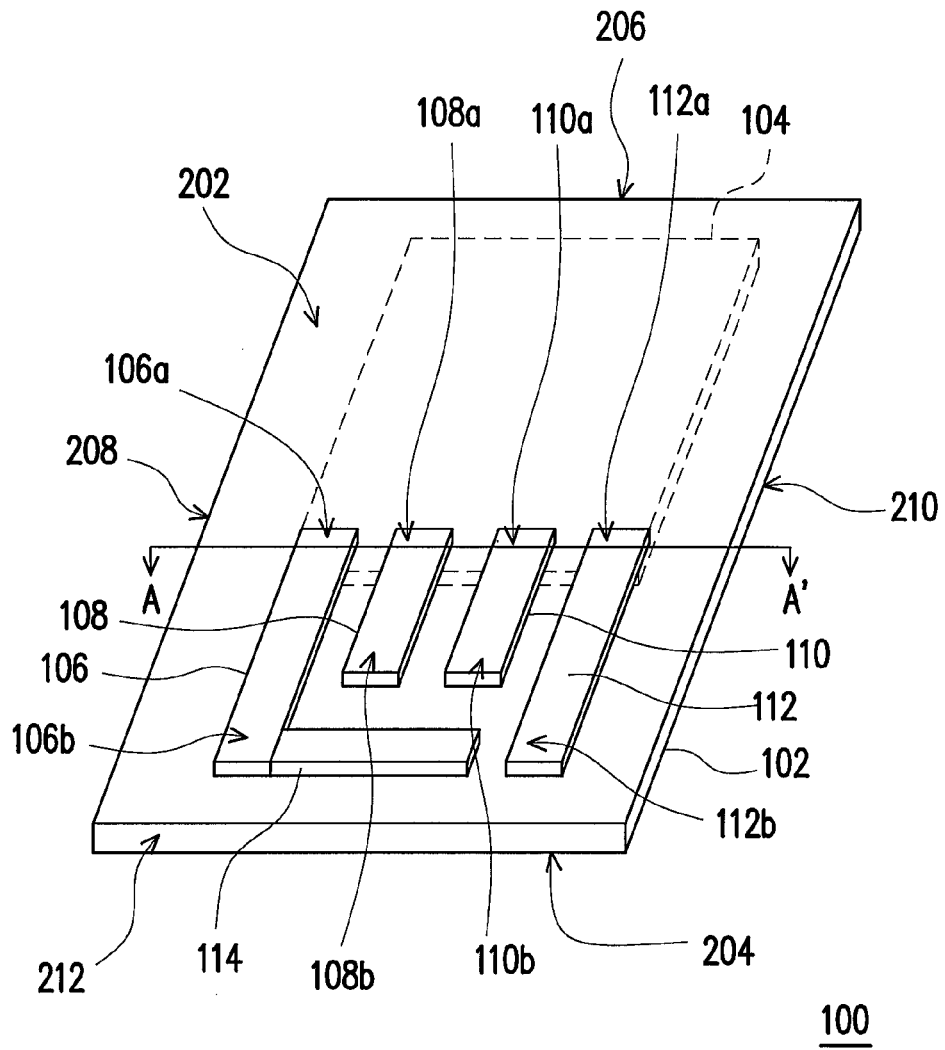
FIG. 1 is a three-dimensional diagram illustrating a flash memory storage apparatus according to a first exemplary embodiment of the present invention.
Figure 2:
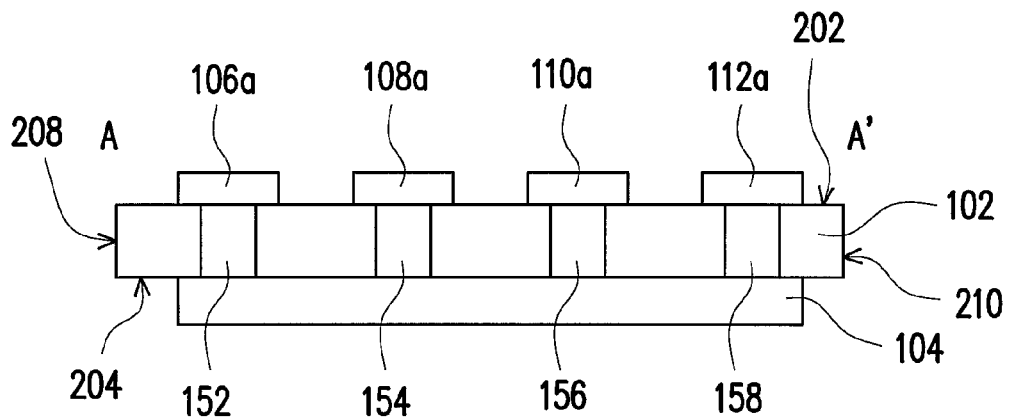
FIG. 2 is a cross-sectional view taken along line A-A' of FIG. 1.

FIG. 1 is a three-dimensional diagram illustrating a flash memory storage apparatus according to a first exemplary embodiment of the present invention, and FIG. 2 is a cross-sectional view taken along line A-A' in FIG. 1.

Referring to FIG. 1 and FIG. 2, a flash memory storage apparatus 100 includes a substrate 102, a control and storage circuit unit 104, a first ground lead 106, a positive signal lead 108, a negative signal lead 110, a power lead 112, and a second ground lead 114, wherein the first ground lead 106, the positive signal lead 108, the negative signal lead 110, the power lead 112, and the second ground lead 114 is used to detachably electrically connected to a connection port of a host.

The substrate 102 has a front surface 202, a back surface 204, and four side surfaces 206, 208, 210 and 212. The front surface 202 and the back surface 204 of the substrate 102 are disposed with a plurality of circuit units. Moreover, the circuit units are electrically connected via the leads that are disposed on the substrate 102.

The control and storage circuit unit 104, which is the main circuit of the flash memory storage apparatus 100, is disposed on the substrate 102. In the present exemplary embodiment, the control and storage circuit unit 104 is disposed on the back surface 204. However, it should be understood that in another exemplary embodiment of the present invention, the control and storage circuit unit 104 can be disposed on the front surface 202. On the other hand, a portion of the control and storage circuit unit 104 can be disposed on the front surface 202 and another portion of the control and storage circuit unit 104 is disposed on the back surface 204.

In the present exemplary embodiment, the control and storage circuit unit 104 includes a control circuit configured to control the operation of a flash memory storage apparatus 100, and the control circuit has at least one temporary storage memory unit (not shown). In another exemplary embodiment of the present invention, the control and storage circuit unit 104 further includes a non-volatile memory, such as a flash memory circuit, configured to store data.

In the present exemplary embodiment, the aforementioned non-volatile memory is a flash memory circuit which is a multi level cell (MLC) NAND flash memory circuit. However, it must be understood that the present invention is not limited thereto. In another exemplary embodiment of the present invention, the aforementioned non-volatile memory is a single level cell (SLC) NAND flash memory circuit.

The control circuit includes a microprocessor unit, a buffer, a host interface module, a flash memory interface module, an error check and correction module, a power management module, and the like to perform data storage, reading, and erasing in the flash memory circuit.

The power lead 112 and the first ground lead 106 are metal leads configured to transmit power source signals. In addition, the positive signal lead 108 and the negative signal lead 110 are metal leads configured to transmit a positive phase portion and a negative phase portion of a differential signal. In the present exemplary embodiment, the first ground lead 106, the positive signal lead 108, the negative signal lead 110, and the power lead 112 are disposed on the front surface 202 of the substrate 102 in parallel, and electrically connected to the control and storage circuit unit 104 respectively. For example, the first ground lead 106, the positive signal lead 108, the negative signal lead 110, and the power lead 112 that are disposed on the front surface 202 of the substrate 102 are electrically connected to the control and storage circuit unit 104 disposed on the back surface 204 respectively via conductive holes 152, 154, 156, and 158 which penetrated the substrate 102. It should be understood that although the cross-section diagram of FIG. 2 shows the conductive holes 152, 154, 156, and 158 on the same cross-section of the substrate 102, the present invention is not limited thereto. In another exemplary embodiment of the present invention, conductive holes 152, 154, 156, and 158 are also disposed on different cross-sections of the substrate 102.

It should be noted that in the present exemplary embodiment the flash memory storage apparatus 100 is illustrated with the signal leads of the positive signal lead 108 and the negative signal lead 110. Nevertheless, the present invention is not limited thereto, the flash memory storage apparatus 100 is disposed with one or more signal lead(s) according to different data transmission interface specifications.

In the present exemplary embodiment, the first ground lead 106, the positive signal lead 108, the negative signal lead 110, and the power lead 112 have internal pads 106a, 108a, 110a, and 112a respectively for connecting the control and storage circuit unit 104. In addition, the first ground lead 106, the positive signal lead 108, the negative signal lead 110, and the power lead 112 have external pads 106b, 108b, 110b, and 112b respectively. The external pads 106b, 108b, 110b, and 112b are neighboring to an edge 102a of the substrate 102.

Figure 3:
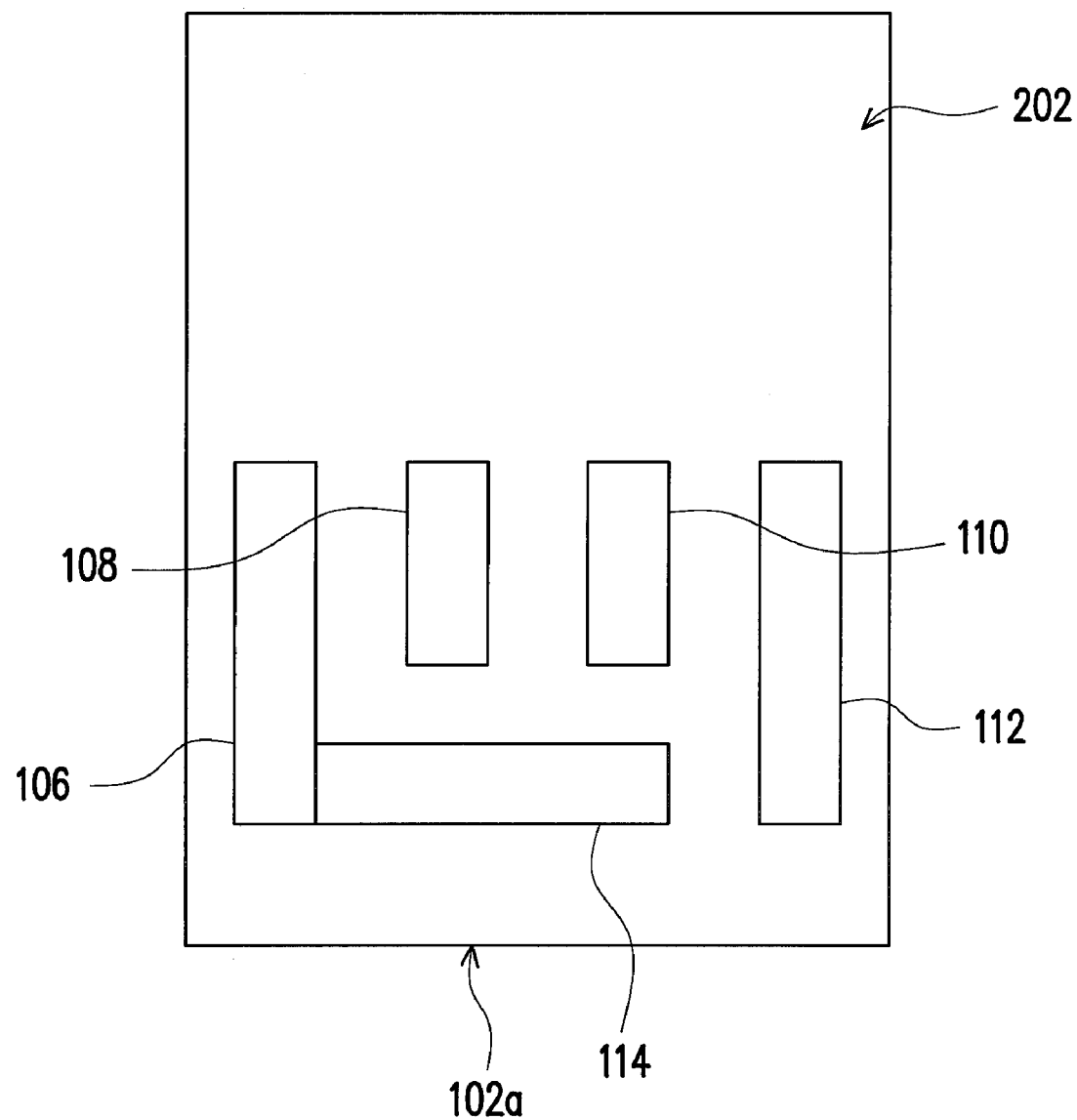
FIG. 3 is a top view of the flash memory storage apparatus in FIG. 1.

FIG. 3 is a top view of the flash memory storage apparatus in FIG. 1.

In one exemplary embodiment of the present invention, a distance between the power lead 112 and the edge 102a is smaller than a distance between the positive signal lead 108 and the edge 102a, and is also smaller than a distance between the negative signal lead 110 and the edge 102a. Furthermore, a distance between the first ground lead 106 and the edge 102a is also smaller than the distance between the positive signal lead 108 and the edge 102a, and the distance between the negative signal lead 110 and the edge 102a. Furthermore, the distance between the power lead 112 and the edge 102a is equal to the distance between the first ground lead 106 and the edge 102a.

The second ground lead 114 is disposed on the front surface 202 of the substrate 102. The second ground lead 114 is a metal lead, which is electrically connected to the first ground lead 106 for extending the same. Specifically, the second ground lead 114 is electrically connected to the external pad 106b of the first ground lead 106, and electrically isolated with the power lead 112, the positive signal lead 108, and the negative signal lead 110. In details, in the present exemplary embodiment, the second ground lead 114 and the first ground lead 106 are electrically connected directly on the front surface 202 of the substrate 102. It should be noted that the second ground lead 114 is closer to the edge 102a than the external pad 108b of the positive signal lead 108 and the external pad 110b of the negative signal lead 110, such that when the user plugs the flash memory storage apparatus 100 into the host, the second ground lead 114 is first electrically connected to the connection port of the host. Therefore, when the flash memory storage apparatus 100 generates a high voltage in the plugging process, the high voltage can be led out via the first ground lead 106 or the second ground lead 114. As a result, a suitable method is provided for leading out the high electrical current generated from the abnormal contact between the storage apparatus and the host via the second ground lead 114, the first ground lead 106, or both of the second ground lead 114 and the first ground lead 106, so as to reduce the possibility of circuit damage.

Figure 4:
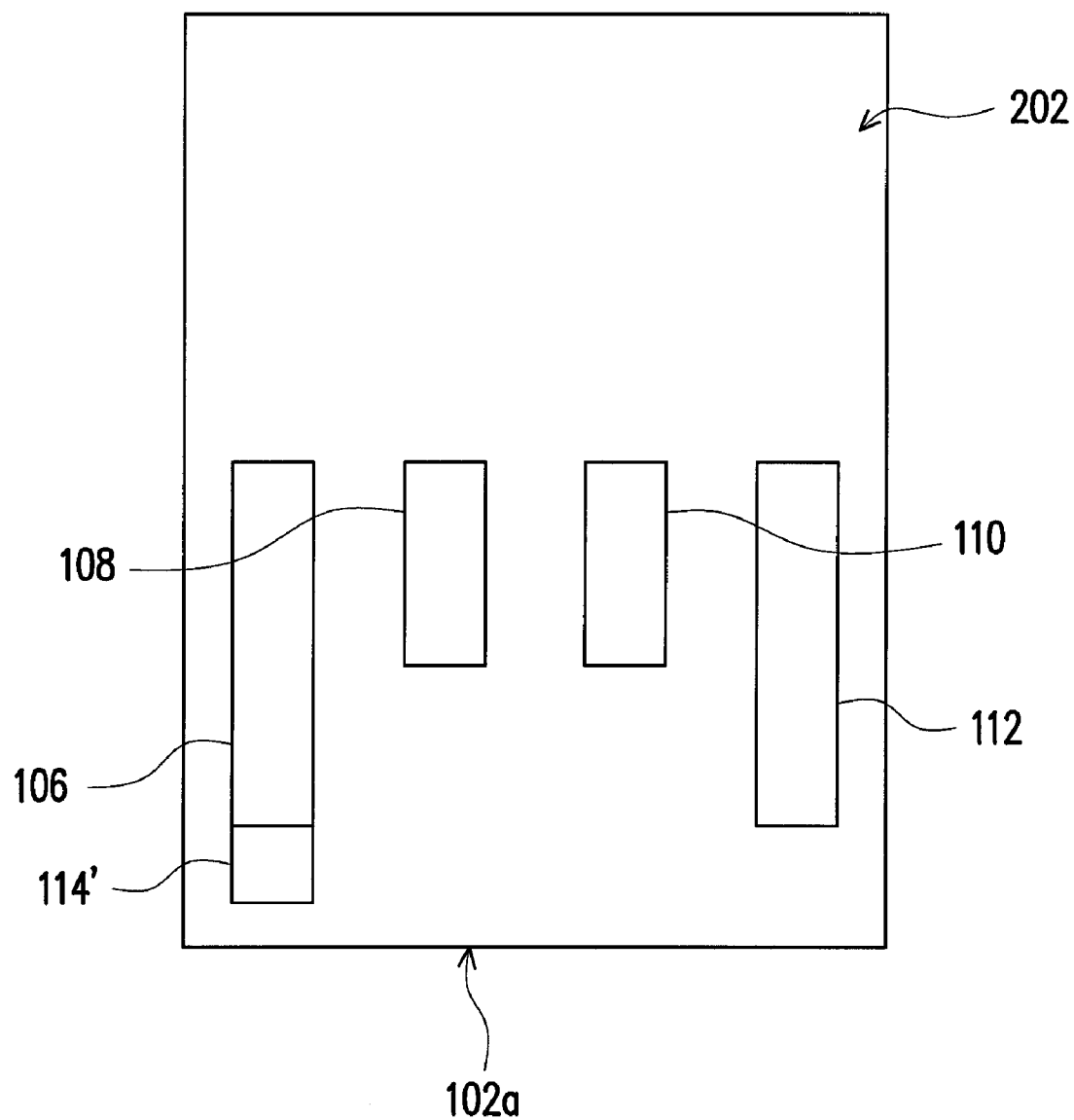
FIG. 4 is a top view illustrating a flash memory storage apparatus according to another exemplary embodiment of the present invention.
Figure 5:
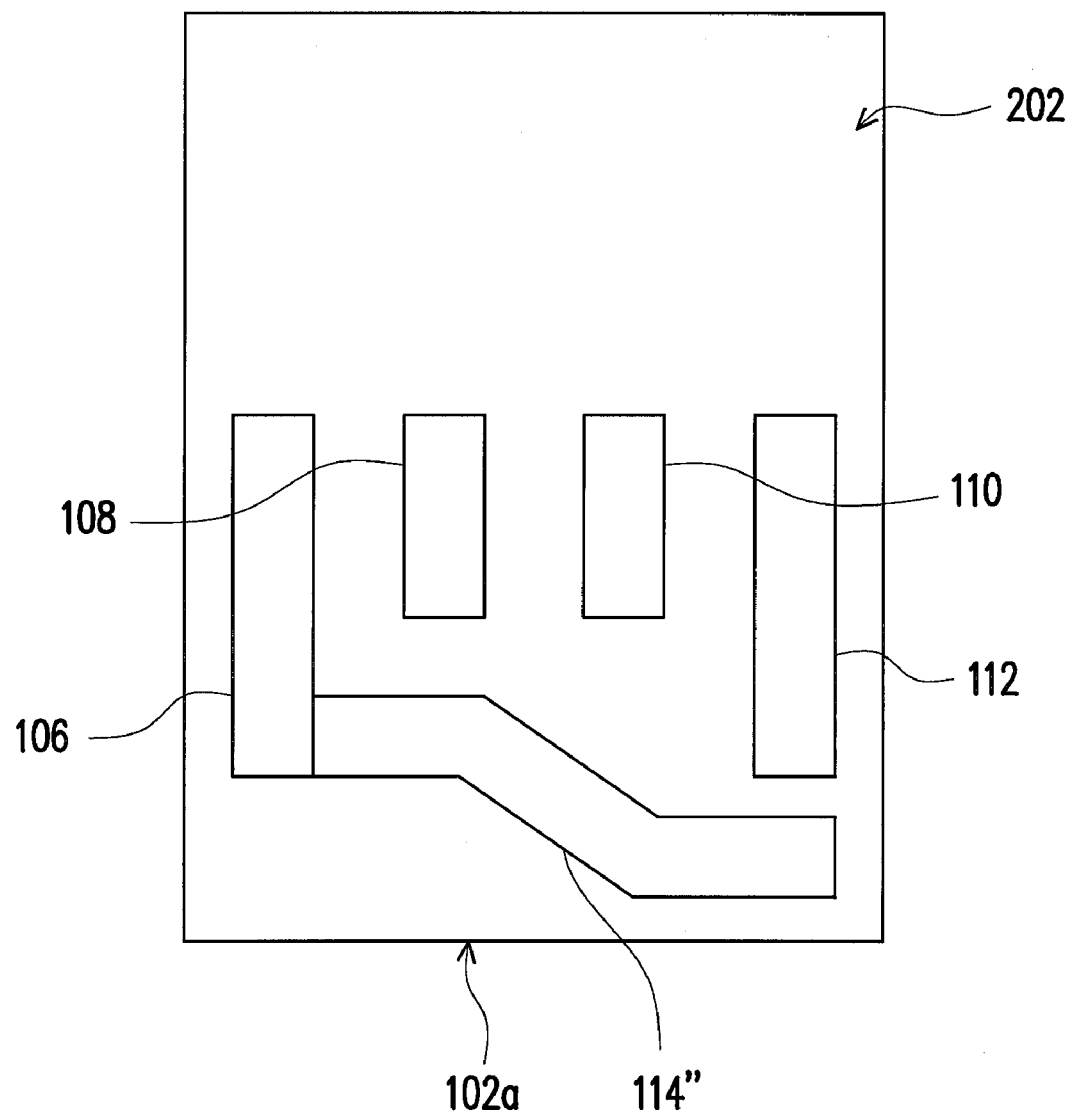
FIG. 5 is a top view illustrating a flash memory storage apparatus according to another exemplary embodiment of the present invention.

In the exemplary embodiment of the present invention, an extending direction of the second ground lead 114 is perpendicular to an extending direction of the first ground lead 106. However, the present invention is not limited thereto. In another exemplary embodiment of the present invention, the extending direction of the second ground lead 114 is parallel to the extending direction of the first ground lead 106 (as shown in FIG. 4). In another exemplary embodiment of the present invention, the second ground lead 114 is electrically connected to the first ground lead 106 and extends to the edge 102a in a regular or irregular manner (as shown in FIG. 5).

Figure 6:
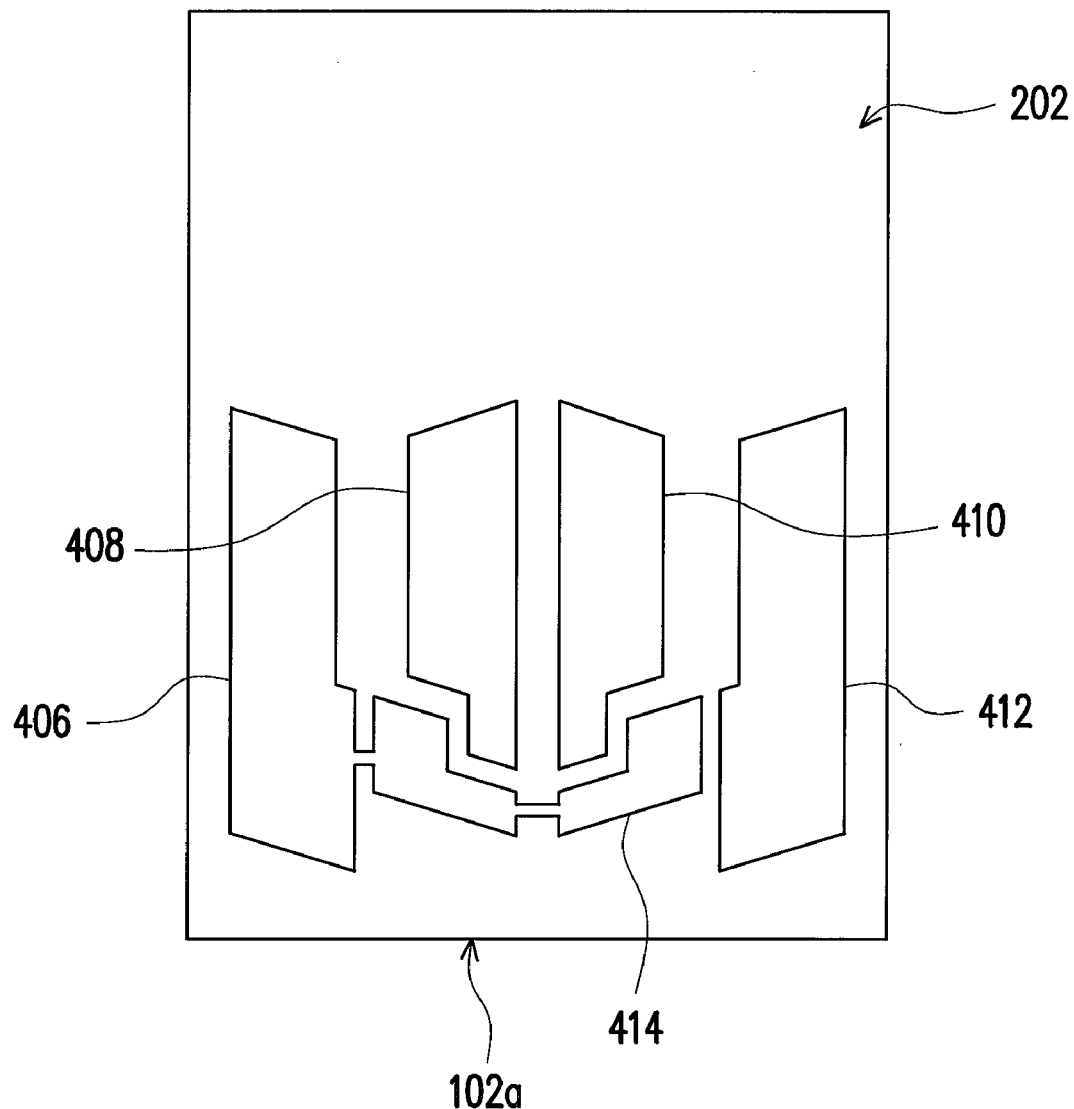
FIG. 6 is a top view illustrating a flash memory storage apparatus according to another exemplary embodiment of the present invention.

Besides, it must be understood that the first ground lead, the positive signal lead, the negative signal lead, the power lead, and the second ground lead are not limited to the shapes aforementioned. For instance, in another exemplary embodiment of the present invention (as illustrated in FIG. 6), a first ground lead 406, a positive signal lead 408, a negative signal lead 410, a power lead 412, and a second ground lead 414 are also disposed in an irregular manner. The functions of the first ground lead 406, the positive signal lead 408, the negative signal lead 410, the power lead 412, and the second ground lead 414 thereof are identical to that illustrated in the first exemplary embodiment except for the shapes thereof, and thus are not repeated herein.

Figure 7:
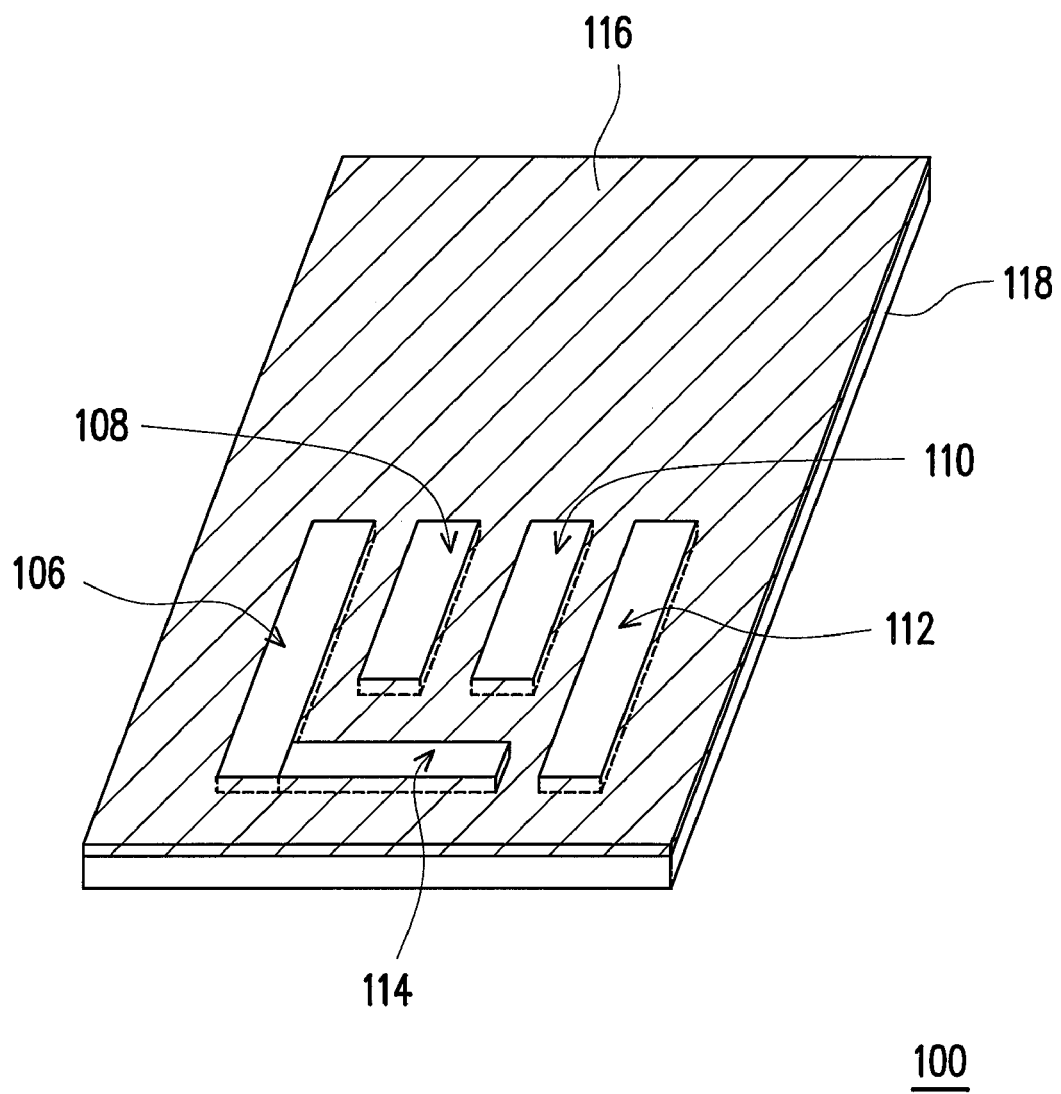
FIG. 7 is a three-dimensional diagram illustrating a flash memory storage apparatus protected by a shielding layer and a protecting layer according to an exemplary embodiment of the present invention.

In the exemplary embodiment of the present invention, the flash memory storage apparatus 100 further includes a shielding layer 116 and the protecting layer 118 to protect the circuit units disposed on the substrate 102. FIG. 7 is a three-dimensional diagram illustrating a flash memory storage apparatus protected by a shielding layer and a protecting layer according to an exemplary embodiment of the present invention.

Referring to FIG. 7, the shielding layer 116 is disposed on the front surface 202 of the substrate 102. The shielding layer 116 covers the front surface 202 of the substrate 102 and exposes the first ground lead 106, the positive signal lead 108, the negative signal lead 110, the power lead 112, and the second ground lead 114. Furthermore, the protecting layer 118 is disposed on the back surface 204 and the side surfaces 206, 208, 210, and 212 of the substrate 102.

In the present exemplary embodiment, a material of the shielding layer 116 is a solder mask and a material of the protecting layer 118 is epoxy resins. It must be understood that the present invention is not limited thereto. Other suitable shielding and protecting materials such as ceramics can also be applied in the present invention, and the shielding layer 116 and the protecting layer 118 can utilize the same or different materials. Furthermore, the thickness of the shielding layer 116 can be the same as or smaller than the thickness of the leads, so that the surfaces of the leads 108~114 and the shielding layer 116 are at the same or different horizontal plane(s). In addition, the shielding layer 116 can be coated on a portion of the second ground lead 114, so that only a portion of the second ground lead 114 is exposed. As a result, the first ground lead 106 and the second ground lead 114 may seem to be independent, but are actually electrically connected to each other.

Figure 8:
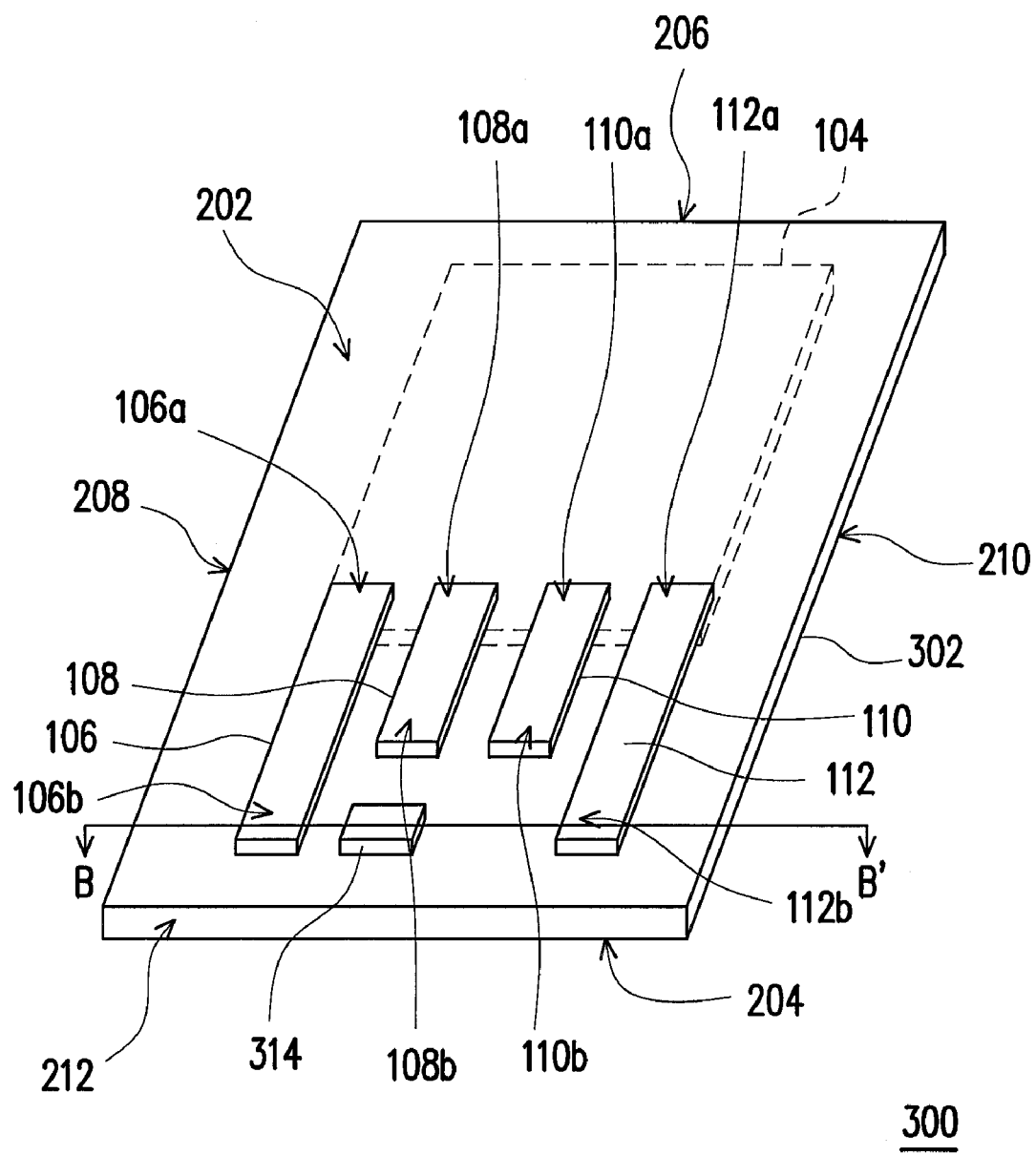
FIG. 8 is a three-dimensional diagram illustrating a flash memory storage apparatus according to a second exemplary embodiment of the present invention.
Figure 9:
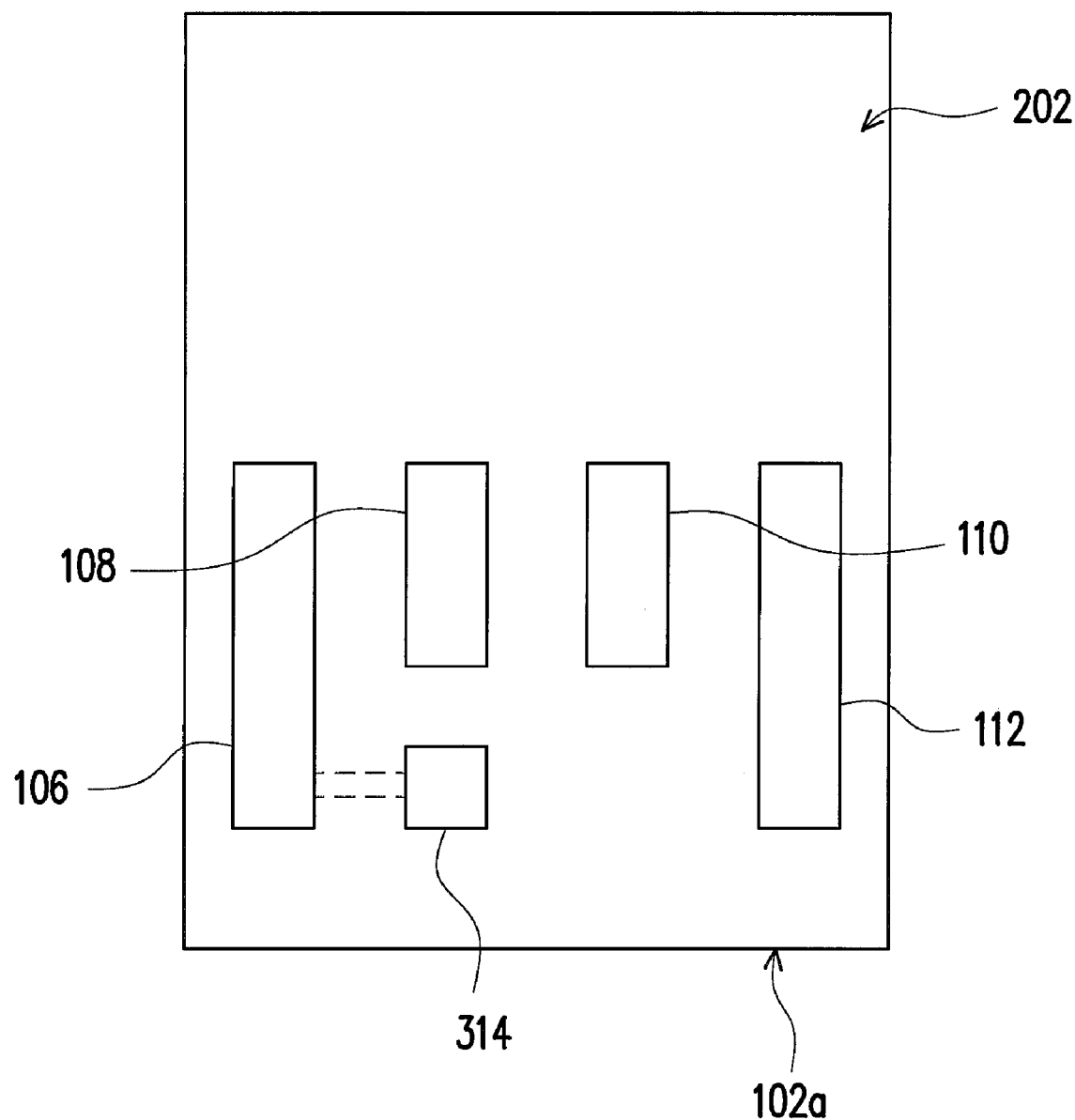
FIG. 9 is a top view of the flash memory storage apparatus in FIG. 8.

FIG. 8 is a three-dimensional diagram illustrating a flash memory storage apparatus according to a second exemplary embodiment of the present invention. FIG. 9 is a top view of the flash memory storage apparatus in FIG. 8. Moreover, FIG. 10 is a cross-sectional view taken along line B-B' of FIG. 8.

Figure 10:
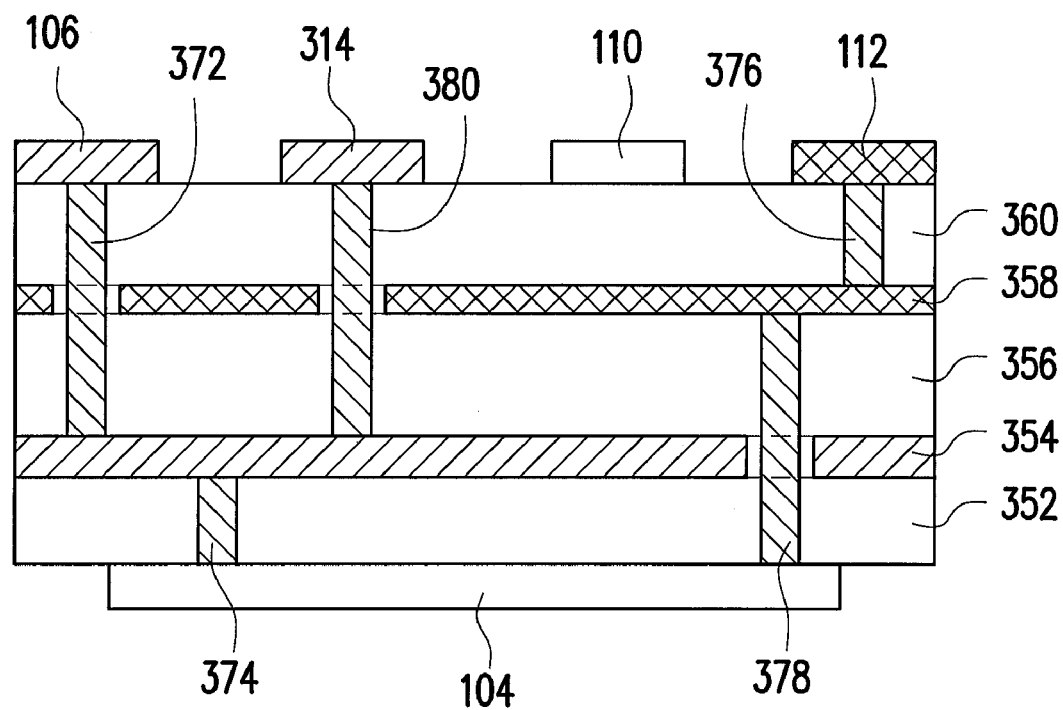
FIG. 10 is a cross-sectional view taken along line B-B' of FIG. 8.

Referring to FIG. 8, FIG. 9, and FIG. 10, a flash memory storage apparatus 300 includes a substrate 302, the control and storage circuit unit 104, the first ground lead 106, the positive signal lead 108, the negative signal lead 110, the power lead 112, and a second ground lead 314.

Structures of the control and storage circuit unit 104, the first ground lead 106, the positive signal lead 108, the negative signal lead 110, and the power lead 112 are illustrated in the foregoing and thus not repeated herein.

Similar to the substrate 102 in the first exemplary embodiment, the substrate 302 has the front surface 202, the back surface 204, and the four side surfaces 206, 208, 210, and 212. However, different from the first exemplary embodiment, a first insulating layer 352, a ground conductive layer 354, a second insulating layer 356, a power conductive layer 358, and a third insulating layer 360 are sequentially disposed within the substrate 302.

In the present exemplary embodiment, the first ground lead 106 is electrically connected to the ground conductive layer 354 via a first conductive hole 372. Moreover, the ground conductive layer 354 is electrically connected to the control and storage circuit unit 104 via a second conductive hole 374. Here, the first conductive hole 372 is electrically isolated with the power conductive layer 358. Furthermore, the power lead 112 is electrically connected to the power conductive layer 358 via a third conductive hole 376, and the power conductive layer 358 is electrically connected to the control and storage circuit unit 104 via a fourth conductive hole 378. Here, the fourth conductive hole 378 is electrically isolated with the ground conductive layer 354.

The second ground lead 314 is disposed on the front surface 202 of the substrate 102. Especially, a distance between the second ground lead 314 and the edge 102a is smaller than the distance between the positive signal lead 108 and the edge 102a, and the distance between the negative signal lead 110 and the edge 102a.

The second ground lead 314 is electrically connected to the first ground lead 106 via the ground conductive layer 354 disposed within the substrate 102. Specifically, the second ground lead 314 is electrically connected to the ground conductive layer 354 via a fifth conductive hole 380, and therefore electrically connects to the first ground lead 106.

It must be understood that although in the present exemplary embodiment, the power conductive layer 358 is disposed above the ground conductive layer 354, the present invention is not limited thereto. In another exemplary embodiment, the ground conductive layer 354 is disposed above the power conductive layer 358. Furthermore, it should be illustrated that FIG. 10 is merely a schematic diagram, the conductive material in the conductive holes 372~380 can be distributed only on the walls of the conductive hole or filling the conductive hole.

Figure 11:
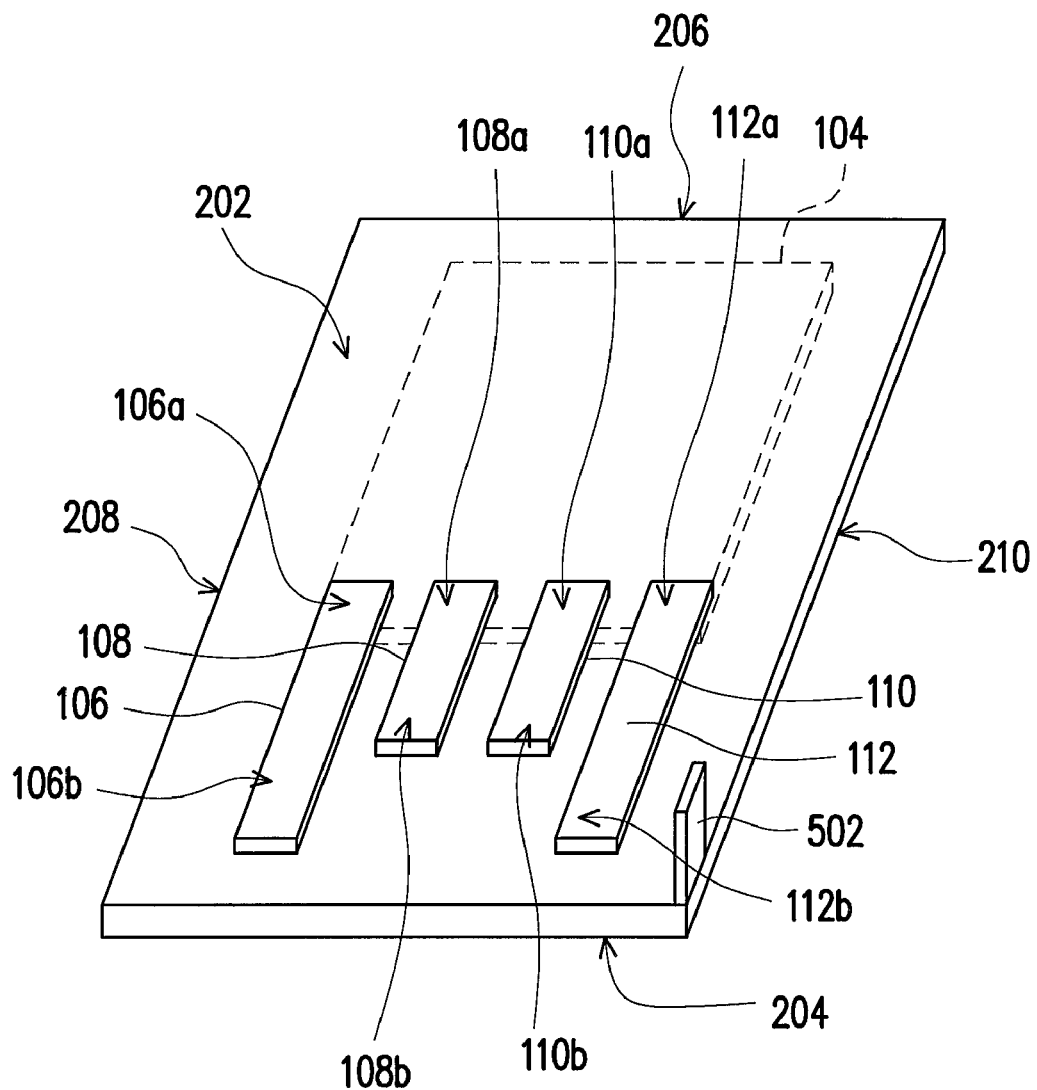
FIG. 11 is a three-dimensional diagram illustrating a flash memory storage apparatus according to a third exemplary embodiment of the present invention.

FIG. 11 is a three-dimensional diagram illustrating a flash memory storage apparatus according to a third exemplary embodiment of the present invention.

Referring to FIG. 11, a flash memory storage apparatus 500 includes the substrate 102, the control and storage circuit unit 104, the first ground lead 106, the positive signal lead 108, the negative signal lead 110, the power lead 112, and a protrusion 502.

Structures of the control and storage circuit unit 104, the first ground lead 106, the positive signal lead 108, the negative signal lead 110, and the power lead 112 are illustrated in the foregoing and thus not repeated herein.

The protrusion 502 is a protrusion disposed on the front surface 202 of the substrate 102. In the present exemplary embodiment, the protrusion 502 is close to the external pad 112b of the power lead 112 and the edge 102a of the substrate 102. However, it should be illustrated that the protrusion 502 can also be close to the external pad 106b of the first ground lead 106 and the edge 102a of the substrate 102.

Figure 12:
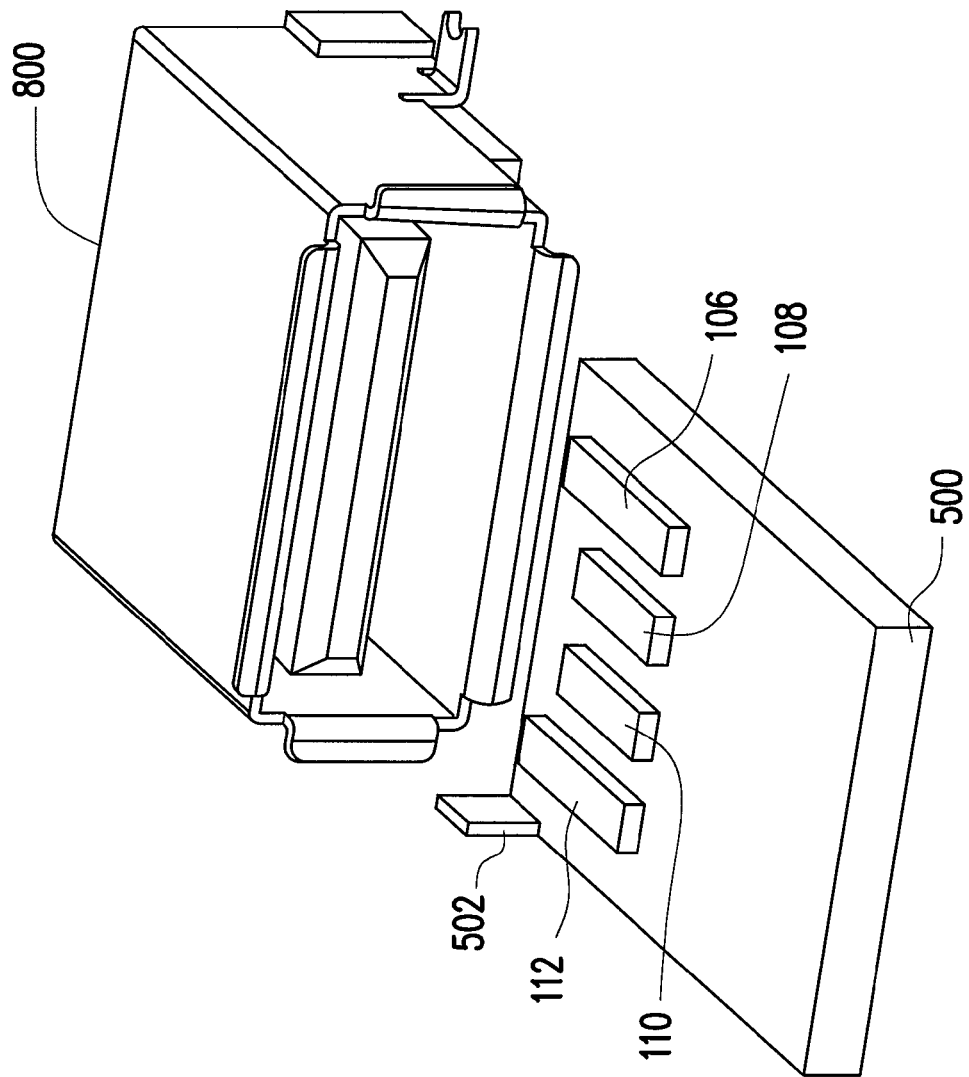
FIG. 12 is a schematic diagram illustrating a connection between the flash memory storage apparatus and a connection port of a host according to the third exemplary embodiment of the present invention.

FIG. 12 is a schematic diagram illustrating a connection between the flash memory storage apparatus and a connection port of the host according to the third exemplary embodiment of the present invention.

Referring to FIG. 12, when the user plugs the flash memory storage apparatus 500 into a connection port 800 of the host, the protrusion 502 facilitates the flash memory storage apparatus 500 to be plugged into the connection port 800 of the host at a correct angle with its blockage effect. In other words, when the flash memory storage apparatus 500 is not plugged into the connection port 800 at a correct angle, the protrusion 502 corrects the plug-in angle of the flash memory storage apparatus 500. Therefore, the first ground lead 106 is first electrically connected to the connection port 800 of the host, thereby leading out the high voltage generated by the flash memory storage apparatus 500 in the plugging process via the first ground lead 106.

In the present exemplary embodiment, the protrusion 502 has a cylindrical shape and the horizontal cross-section thereof is a quadrangle. However, the present invention is not limited thereto. In another exemplary embodiment of the present invention, the horizontal cross-section of the protrusion 502 has a circular shape, a polygonal shape, or other irregular shapes. Besides, the material of the protrusion 502 is a conductive material or an insulating material.

Similarly, in one exemplary embodiment of the present invention, the flash memory storage apparatus 500 further includes the shielding layer 116 and the protecting layer 118 as described in the first exemplary embodiment to protect the circuit units disposed on the substrate 102. Herein, the shielding layer 116 covers the front surface 202 of the substrate 102 and exposes the first ground lead 106, the positive signal lead 108, the negative signal lead 110, and the power lead 112.

In summary, the substrate of the flash memory storage apparatus is disposed with the second ground lead in the present invention. When the flash memory storage apparatus of the present invention is plugged into the connection port of the host, the second ground lead electrically connects to the connection port of the host. Hence, when a high voltage is generated in the plugging process of the flash memory storage apparatus, the high voltage can be led out via the second ground lead to prevent the circuit unit of the flash memory storage apparatus from being damaged.

Also, the protrusion is disposed on the substrate of the flash memory storage apparatus of the present invention, thereby facilitating the user to plug the flash memory storage apparatus into the connection port of the host at a correct angle, so that the ground lead electrically connects to the connection port of the host. Hence, when the high voltage is generated in the plugging process of the flash memory storage apparatus, the high voltage can be led out via the ground lead to prevent the circuit unit of the flash memory storage apparatus from being damaged.

Although the present invention has been described with reference to the above exemplary embodiments, it will be apparent to one of the ordinary skill in the art that modifications to the described exemplary embodiment may be made without departing from the spirit of the invention. Accordingly, the scope of the invention will be defined by the attached claims not by the above detailed descriptions.

What is claimed is:

1. A flash memory storage apparatus, comprising:
   a substrate, having a front surface, a back surface, a first side surface, a second side surface, a third side surface and a fourth side surface;
   a control and storage circuit unit, disposed on the substrate;
   a power lead, at least one signal lead, and a first ground lead, separately disposed on the front surface of the substrate in intervals and electrically connected to the control and storage circuit unit respectively and the power lead, the at least one signal lead, and the first ground lead are near a first side surface; and
   at least one second ground lead, disposed on the front surface and disposed between the signal lead and the first side surface of the substrate, wherein one end of the second ground lead electrically connects to the first ground lead and the other end of the second ground lead extends to the second side surface or the power lead,
   wherein the second ground lead is electrically isolated with the power lead and the at least one signal lead, and
   wherein the power lead, the at least one signal lead, and a first ground lead are detachably electrically connected to a connection port of a host.

2. The flash memory storage apparatus as claimed in claim 1, wherein the power lead and the first ground lead have the same length.

3. The flash memory storage apparatus as claimed in claim 1, wherein the power lead, the at least one signal lead, and the first ground lead have an internal pad and an external pad respectively, and the internal pads are connected to the control and storage circuit unit.

4. The flash memory storage apparatus as claimed in claim 1, wherein a distance between the at least one second ground lead and the first side surface is smaller than a distance between the power lead and the first side surface.

5. The flash memory storage apparatus as claimed in claim 1, wherein the extending direction of the at least one second ground lead is perpendicular to the extending direction of the first ground lead.

6. The flash memory storage apparatus as claimed in claim 1, wherein an extending direction of the at least one second ground lead is parallel to an extending direction of the first ground lead.

7. The flash memory storage apparatus as claimed in claim 1, wherein the distance between the power lead and the first side surface and a distance between the first ground lead and the first side surface are respectively smaller than a distance between the at least one signal lead and the first side surface.

8. The flash memory storage apparatus as claimed in claim 3, further comprising a shielding layer, covering the front surface and exposing the power lead, the at least one signal lead, the first ground lead, and the at least one second ground lead.

9. The flash memory storage apparatus as claimed in claim 8, wherein a material of the shielding layer is a solder mask.

10. The flash memory storage apparatus as claimed in claim 1, further comprising a protecting layer, covering the back surface, the first side surface, the second side surface, the third side surface and the fourth side surface.

11. The flash memory storage apparatus as claimed in claim 10, wherein a material of the protecting layer is epoxy resins.

12. The flash memory storage apparatus as claimed in claim 1, wherein the at least one signal lead comprises a positive signal lead and a negative signal lead, wherein the positive signal lead and the negative signal lead are adapted to transmit differential signals.

13. A flash memory storage apparatus, comprising:
    a substrate, having a front surface;
    a control and storage circuit unit, disposed on the substrate;
    a power lead, at least one signal lead, and a first ground lead, separately disposed on the front surface of the substrate in intervals and electrically connected to the control and storage circuit unit respectively and the power lead, the at least one signal lead, and the first ground lead are near a first side surface; and
    at least one second ground lead, disposed on the front surface and located between the at least one signal lead and the first side surface of the substrate,
    wherein the first side surface is away from the control and storage circuit unit, and the at least one second ground lead and the first ground lead have the same voltage level,
    wherein the at least one second ground lead is electrically isolated with the power lead and the at least one signal lead,
    wherein the power lead, the at least one signal lead, and the first ground lead are detachably electrically connected to a connection port of a host.

14. The flash memory storage apparatus as claimed in claim 13, wherein the second ground lead has an irregular configuration.

15. The flash memory storage apparatus as claimed in claim 13, further comprising a shielding layer, covering on a portion of the second ground lead.

* * * * *